US008797795B2

(12) United States Patent
Graef et al.

(10) Patent No.: US 8,797,795 B2
(45) Date of Patent: Aug. 5, 2014

(54) METHODS AND APPARATUS FOR INTERCELL INTERFERENCE MITIGATION USING MODULATION CODING

(75) Inventors: Nils Graef, Foster City, CA (US); Erich F. Haratsch, Bethlehem, PA (US); Milos Ivkovic, Sunnyvale, CA (US); Victor Krachkovsky, Allentown, PA (US); Andrei Vityaev, San Jose, CA (US); Johnson Yen, Fremont, CA (US)

(73) Assignee: LSI Corporation, San Jose, CA (US)

( * ) Notice: Subject to any disclaimer, the term of this patent is extended or adjusted under 35 U.S.C. 154(b) by 560 days.

(21) Appl. No.: 13/001,310

(22) PCT Filed: Jun. 30, 2009

(86) PCT No.: PCT/US2009/049330
§ 371 (c)(1),
(2), (4) Date: May 25, 2011

(87) PCT Pub. No.: WO2010/002945
PCT Pub. Date: Jan. 7, 2010

(65) Prior Publication Data
US 2011/0216586 A1    Sep. 8, 2011

Related U.S. Application Data

(60) Provisional application No. 61/133,921, filed on Jul. 7, 2008, provisional application No. 61/134,688, filed on Jul. 10, 2008, provisional application No. 61/194,751, filed on Sep. 30, 2008, provisional application No. 61/135,732, filed on Jul. 22, 2008, provisional application No. 61/133,675, filed on Jul. 1, 2008.

(51) Int. Cl.
*G11C 16/04* (2006.01)

(52) U.S. Cl.
USPC ................................ 365/185.02; 365/185.03

(58) Field of Classification Search
USPC ........................... 365/185.02, 185.03, 185.33
See application file for complete search history.

(56) References Cited

U.S. PATENT DOCUMENTS 5,910,915 A    6/1999  Guterman et al.
7,897,953 B2 *  3/2011  Liu .................................. 257/2
(Continued)

FOREIGN PATENT DOCUMENTS

JP       2008123653       11/2009
WO    WO 2007/149678      12/2007

OTHER PUBLICATIONS

Yang et al., "The Impact of Interference on Multi-Level-Cell Application in Scaled Nitride-Storage Flash Memory," IEEE International Conference on Memory Technology and Design, pp. 124-125 (2008).

(Continued)

Primary Examiner — Huan Hoang
(74) Attorney, Agent, or Firm — Ryan, Mason & Lewis, LLP

(57) ABSTRACT

Methods and apparatus are provided for intercell interference mitigation using modulation coding. During programming of a flash memory, a modulation encoding is performed that selects one or more levels for programming the flash memory such that a reduced number of cells in the flash memory are programmed with a value that violates one or more predefined criteria. During a reading of a flash memory, a modulation decoding is performed that assigns one or more levels to cells in the flash memory such that a reduced number of cells in the flash memory are read with a value that violates one or more predefined criteria. The predefined criteria can be based, for example, on one or more of an amount of disturbance caused by the programmed cell; a voltage shift of a programmed cell; a voltage stored by a programmed cell; an amount of change in current through a programmed cell; and an amount of current through a programmed cell.

38 Claims, 10 Drawing Sheets

(56) References Cited

U.S. PATENT DOCUMENTS

| | | |
|---|---|---|
| 2006/0209592 A1 | 9/2006 | Li et al. |
| 2007/0171714 A1 | 7/2007 | Wu et al. |
| 2007/0189073 A1 | 8/2007 | Aritome |
| 2008/0055984 A1 | 3/2008 | Nazarian |
| 2008/0055990 A1 | 3/2008 | Ishikawa et al. |
| 2008/0212367 A1 | 9/2008 | Kim et al. |
| 2008/0266149 A1* | 10/2008 | Hollmann et al. ............... 341/94 |
| 2008/0301532 A1 | 12/2008 | Uchikawa et al. |
| 2009/0080249 A1* | 3/2009 | Sprouse et al. ........... 365/185.03 |
| 2009/0129153 A1* | 5/2009 | Sarin et al. ................ 365/185.03 |
| 2013/0141981 A1 | 6/2013 | Nazarian |

OTHER PUBLICATIONS

Cho et al., "A.3.3V 1Gb Multi-Level NAND Flash Memory with Non-Uniform Threshold Voltgage Distribution," IEEE international Solid-State Circuits Conference (Feb. 5-7, 2001).

\* cited by examiner

METHODS AND APPARATUS FOR INTERCELL INTERFERENCE MITIGATION USING MODULATION CODING

CROSS-REFERENCE TO RELATED APPLICATIONS

The present application claims priority to U.S. Provisional Patent Application Ser. No. 61/133,675, filed Jul. 1, 2008; U.S. Provisional Patent Application Ser. No. 61/133,921, filed Jul. 3, 2008; U.S. Provisional Patent Application Ser. No. 61/134,688, filed Jul. 10, 2008; U.S. Provisional Patent Application Ser. No. 61/135,732, filed Jul. 22, 2008; and U.S. Provisional Patent Application Ser. No. 61/194,751, filed Sep. 30, 2008, each incorporated by reference herein.

The present application is related to International Patent Application Serial No. PCT/US09/36810, filed Mar. 11, 2009, entitled "Methods and Apparatus for Storing Data in a Multi-Level Cell Flash Memory Device with Cross-Page Sectors, Multi-Page Coding and Per-Page Coding," and International Patent Application entitled "Methods and Apparatus for Read-Side Intercell Interference Mitigation in Flash Memories;" International Patent Application entitled "Methods and Apparatus for Write-Side Intercell Interference Mitigation in Flash Memories;" International Patent Application entitled "Methods and Apparatus for Interfacing Between a Flash Memory Controller and a Flash Memory Array;" and International Patent Application entitled "Methods and Apparatus for Soft Demapping and Intercell Interference Mitigation in Flash Memories," each filed contemporaneously herewith and incorporated by reference herein.

FIELD OF THE INVENTION

The present invention relates generally to flash memory devices and more particularly, to modulation coding techniques for mitigating the effect of intercell interference and other distortions in such flash memory devices.

BACKGROUND OF THE INVENTION

A number of memory devices, such as flash memory devices, use analog memory cells to store data. Each memory cell stores an analog value, also referred to as a storage value, such as an electrical charge or voltage. The storage value represents the information stored in the cell. In flash memory devices, for example, each analog memory cell typically stores a certain voltage. The range of possible analog values for each cell is typically divided into threshold regions, with each region corresponding to one or more data bit values. Data is written to an analog memory cell by writing a nominal analog value that corresponds to the desired one or more bits.

Single-level cell (SLC) flash memory devices, for example, store one bit per memory cell (or two possible memory states). Multi-level cell (MLC) flash memory devices, on the other hand, store two or more bits per memory cell (i.e., each cell has four or more programmable states). For a more detailed discussion of MLC flash memory devices, see, for example, International Patent Application Serial No. PCT/US09/36810, filed Mar. 11, 2009, entitled "Methods and Apparatus for Storing Data in a Multi-Level Cell Flash Memory Device with Cross-Page Sectors, Multi-Page Coding And Per-Page Coding," incorporated by reference herein.

In multi-level NAND flash memory devices, for example, floating gate devices are employed with programmable threshold voltages in a range that is divided into multiple intervals with each interval corresponding to a different multibit value. To program a given multibit value into a memory cell, the threshold voltage of the floating gate device in the memory cell is programmed into the threshold voltage interval that corresponds to the value.

The analog values stored in memory cells are often distorted. The distortions are typically due to, for example, back pattern dependency (BPD), noise and intercell interference (ICI). For a more detailed discussion of distortion in flash memory devices, see, for example, J. D. Lee et al., "Effects of Floating-Gate Interference on NAND Flash Memory Cell Operation," IEEE Electron Device Letters, 264-266 (May 2002) or Ki-Tae Park, et al., "A Zeroing Cell-to-Cell Interference Page Architecture With Temporary LSB Storing and Parallel MSB Program Scheme for MLC NAND Flash Memories," IEEE J. of Solid State Circuits, Vol. 43, No. 4, 919-928, (April 2008), each incorporated by reference herein.

ICI is a consequence of parasitic capacitances between cells and is generally considered to be the most prominent source of distortion. Id. For example, ICI is known to increase with technology scaling and becomes a significant source of distortion of the threshold voltage distribution as transistor sizes become smaller. Thus, ICI is of particular concern for reliable MLC memories, as ICI limits the number of voltage levels that can reliably be stored in the MLC memory.

A number of techniques have been proposed or suggested for mitigating the effect of ICI by reducing the capacitive coupling between cells. For example, Ki-Tae Park, et al. describe existing programming techniques, such as even/odd programming, bottom up programming and multi-stage programming that mitigate ICI. While these existing methods have helped to reduce the effect of ICI, they become less effective as transistor sizes are reduced, for example, below 65 nm technologies, where parasitic capacitances are much larger due to the close proximity of flash cells. A need therefore exists for improved signal processing and coding techniques for mitigating the effect of ICI, BPD and other distortions.

SUMMARY OF THE INVENTION

Generally, methods and apparatus are provided for intercell interference mitigation using modulation coding. These modulation coding techniques can be used to mitigate other distortions as well. According to one aspect of the invention, during programming of a flash memory, a modulation encoding is performed that selects one or more levels for programming the flash memory such that a reduced number of cells in the flash memory are programmed with a value that violates one or more predefined criteria. In a number of exemplary variations, the one or more predefined criteria is based on one or more of an amount of disturbance caused by the programmed cell; a voltage shift of a programmed cell; a voltage stored by a programmed cell; an amount of change in current through a programmed cell: and an amount of current through a programmed cell.

Another aspect of the invention remaps one or more program states to ensure that one or more program states have a predefined binary value. A precoder can optionally be applied following a parity encoding to reduce error propagation at an output of a modulation decoder.

The present invention recognizes that a first predefined binary value may cause more disturbance than a second predefined binary value and thus the modulation encoding selects one or more levels for programming the flash memory such that a reduced number of cells in the flash memory are programmed with the first predefined binary value. In one illustrative embodiment, the modulation encoding flips all k bits in k user bits if there are more than k/2 of the first predefined binary value.

According to another aspect of the invention, during a reading of a flash memory, a modulation decoding is performed that assigns one or more levels to cells in the flash memory such that a reduced number of cells in the flash memory are read with a value that violates one or more predefined criteria.

According to yet another aspect of the invention, during programming of a flash memory, one or more levels are selected for programming the flash memory such that a reduced number of cells in the flash memory are programmed with one or more predefined levels.

A more complete understanding of the present invention, as well as further features and advantages of the present invention, will be obtained by reference to the following detailed description and drawings.

DETAILED DESCRIPTION

Various aspects of the present invention are directed to signal processing techniques for mitigating ICI in memory devices, such as single-level cell or multi-level cell (MLC) NAND flash memory devices. As used herein, a multi-level cell flash memory comprises a memory where each memory cell stores two or more bits. Typically, the multiple bits stored in one flash cell belong to different pages. While the invention is illustrated herein using memory cells that store an analog value as a voltage, the present invention can be employed with any storage mechanism for flash memories, such as the use of voltages or currents to represent stored data, as would be apparent to a person of ordinary skill in the art.

Figure 1:
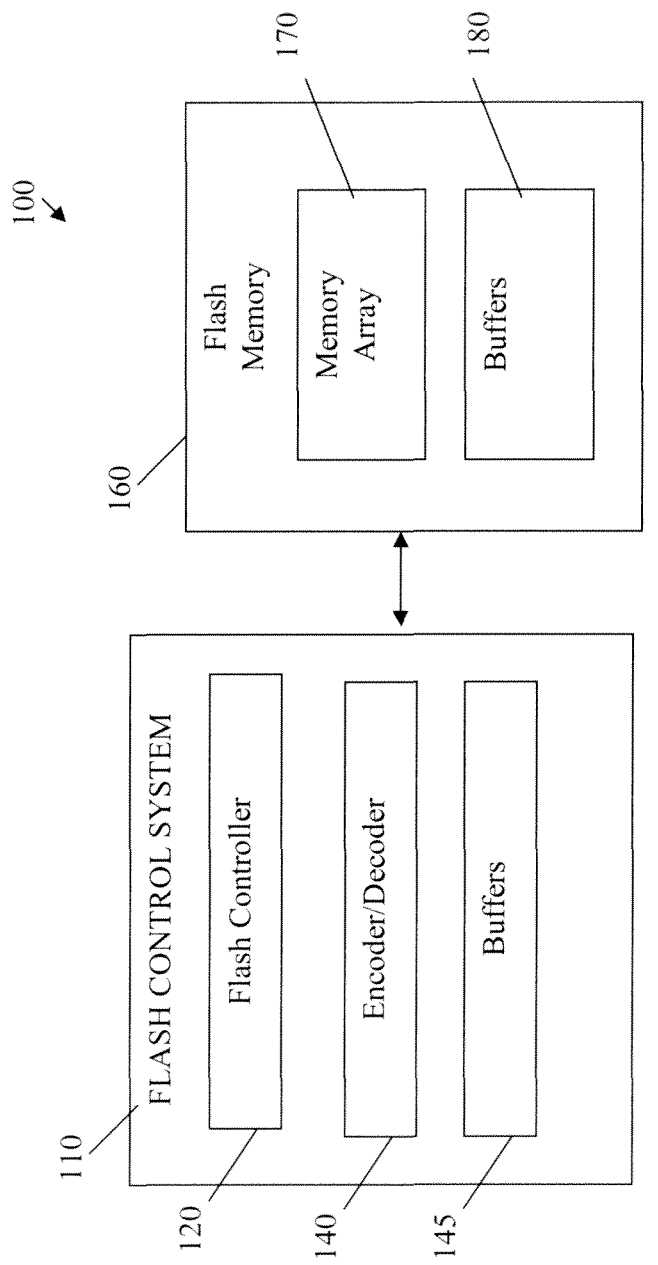
FIG. 1 is a schematic block diagram of a conventional flash memory system.

FIG. 1 is a schematic block diagram of a conventional flash memory system 100. As shown in FIG. 1, the exemplary flash memory system 100 comprises a flash control system 110 and a flash memory block 160. The exemplary flash control system 110 comprises a flash controller 120, an encoder/decoder block 140 and one or more buffers 145. In an alternative embodiment, the encoder/decoder block 140 and some buffers 145 may be implemented inside the flash controller 120. The encoder/decoder block 140 and buffers 145 may be implemented, for example, using well-known commercially available techniques and/or products.

The exemplary flash memory block 160 comprises a memory array 170 and one or more buffers 180 that may each be implemented using well-known commercially available techniques and/or products. The memory array 170 may be embodied as a single-level or multi-level cell flash memory, such as a NAND flash memory, a phase-change memory (PCM), an MRAM memory, a NOR flash memory or another non-volatile flash memory. While the invention is illustrated primarily in the context of a multi-level cell NAND flash memory, the present invention can be applied to single-level cell flash memories and other non-volatile memories as well, as would be apparent to a person of ordinary skill in the art.

Multi-Level Cell Flash Memory

Figure 2:
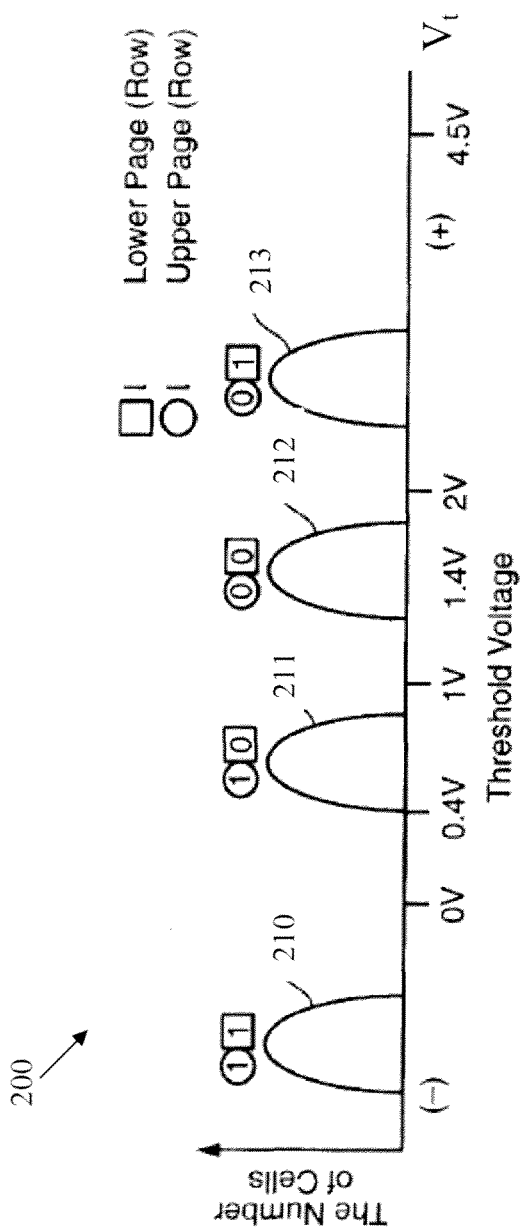
FIG. 2 illustrates an exemplary threshold voltage distribution for the exemplary multi-level cell flash memory of FIG. 1.

In a multi-level cell NAND flash memory, a threshold detector is typically employed to translate the voltage value associated with a particular cell to a predefined memory state. FIG. 2 illustrates an exemplary threshold voltage distribution for the exemplary multi-level cell flash memory 170 of FIG. 1, based on the teachings of U.S. Pat. No. 6,522,580, incorporated by reference herein. Generally, the threshold voltage of a cell is the voltage that needs to be applied to the cell so that the cell conducts a certain amount of current. The threshold voltage is a measure for the data stored in a cell.

In the exemplary embodiment shown in FIG. 2, each storage element employs four possible data states to store two bits of data in each memory cell. FIG. 2 illustrates four peaks 210-213, with each peak corresponding to one state. In a multi-level cell flash device, the different peaks 210-213 of the threshold voltage distribution graph 200 are used for storing two bits in the cell.

The peaks 210-213 of the threshold voltage distribution graph 200 are labeled with corresponding binary values. Thus, when a cell is in a first state 210, it represents a "1" for the lower bit (also known as least significant bit, LSB) and a "1" for the upper bit (also known as most significant bit, MSB). State 210 is generally the initial unprogrammed or erased state of the cell. Likewise. when a cell is in the second state 211, it represents a "0" for the lower bit and a "1" for the upper bit. When a cell is in the third state 212, it represents a "0" for the lower bit and a "0" for the upper bit. Finally, when a cell is in the fourth state 213, it represents a "1" for the lower bit and a "0" for the upper bit.

Threshold voltage distribution 210 represents a distribution of the threshold voltages $V_t$ of the cells within the array that are in an erased state ("11" data state). with negative threshold voltage levels below 0 volts. Threshold voltage distributions 211 and 212 of memory cells storing "10" and "00" user data, respectively, are shown to be between 0 and 1 volts and between 1 and 2 volts. respectively. Threshold voltage distribution 213 shows the distribution of cells that have been programmed to the "01" data state, with a threshold voltage level set between 2 and 4.5 volts of the read pass voltage.

Thus, in the exemplary embodiment of FIG. 2, 0 volts, 1 volt and 2 volts can be used as voltage level thresholds between each level or state. The voltage level thresholds are used by the flash memory 160 (e.g., sensing circuits in the flash memory 160) to determine the voltage level or state of a given cell. The flash memory 160 will assign one or more bits to each cell based on a comparison of the measured voltages to the voltage level thresholds, which are then transmitted as hard decisions to the flash control system 110. In addition or alternatively, in an implementation using soft information, the flash memory 160 may transmit the measured voltages or a quantized version of the measured voltages to the flash control system 110 as soft information, where a larger number of bits is used to represent the measured voltage than the number of bits stored in the memory cell.

It is further noted that cells are typically programmed using well-known Program/Verify techniques. Generally, during a Program/Verify cycle, the flash memory 160 gradually applies an increasing voltage to store a charge in the cell transistor until a minimum target threshold voltage is exceeded. For example, when programming a '10' data state in the example of FIG. 2, the flash memory 160 may gradually apply an increasing voltage to store a charge in the cell transistor until a minimum target threshold voltage of 0.4V is exceeded.

As discussed further below, each of the two bits stored in a single memory cell is from a different page. In other words, each bit of the two bits stored in each memory cell carries a different page address. The right side bit shown in FIG. 2 is accessed when a lower page address is input. The left side bit is accessed when an upper page address is input.

Figure 3:
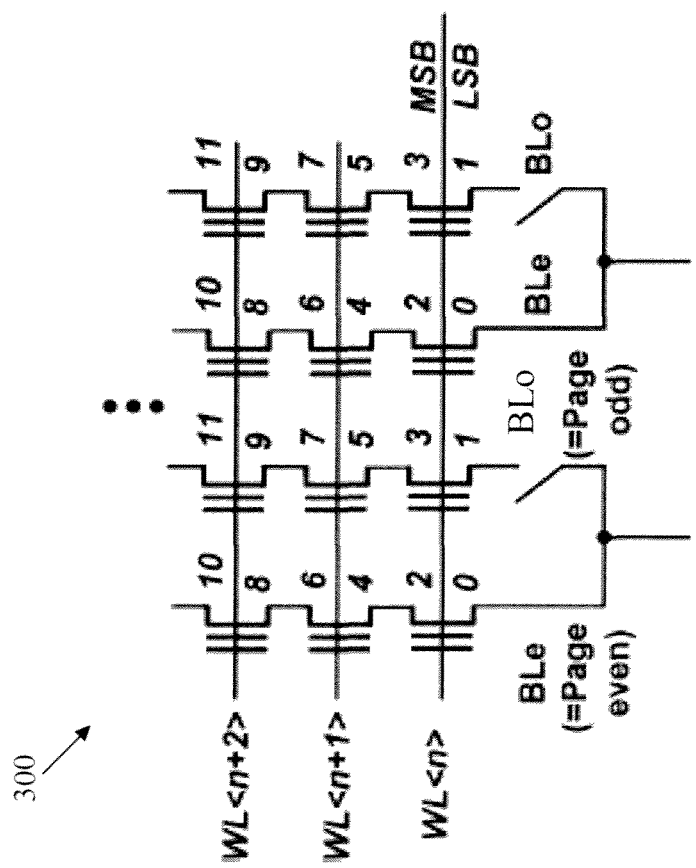
FIG. 3 illustrates the architecture of an exemplary flash cell array in a multi-level cell (MLC) flash memory device.

FIG. 3 illustrates the architecture of an exemplary flash cell array 300 in a multi-level cell (MLC) flash memory device 160, where each exemplary cell typically corresponds to a floating-gate transistor that stores two bits. In FIG. 3 each cell is associated with two numbers for the two pages to which the two bits belong. The exemplary cell array section 300 shows wordlines n through n+2 and four bitlines. The exemplary flash cell array 300 is partitioned into even and odd pages, where for example cells with even numbers (such as the cell with the numbers 0 and 2) correspond to even pages, and cells with odd numbers (such as the cell with the numbers 1 and 3) correspond to odd pages. Wordline n stores for example even pages 0 and 2 in the even bitlines, and odd pages 1 and 3 in the odd bit lines.

In addition, FIG. 3 indicates an exemplary program sequence where either an even or odd bitline cell is selected and programmed sequentially (bottom up) in the indicated order. The numbers indicate the order in which the pages are programmed. For example, page 0 is programmed before page 1. For a further discussion of the programming of even and odd pages, see for example K.-T. Park et al., "A Zeroing Cell-to-Cell Interference Page Architecture with Temporary LSB Storing and Parallel MSB Program Scheme for MLC NAND Flash Memories," IEEE Journal of Solid-State Circuits, Vol. 43, No. 4, 919-928 (April 2008), incorporated by reference herein.

Figure 4:
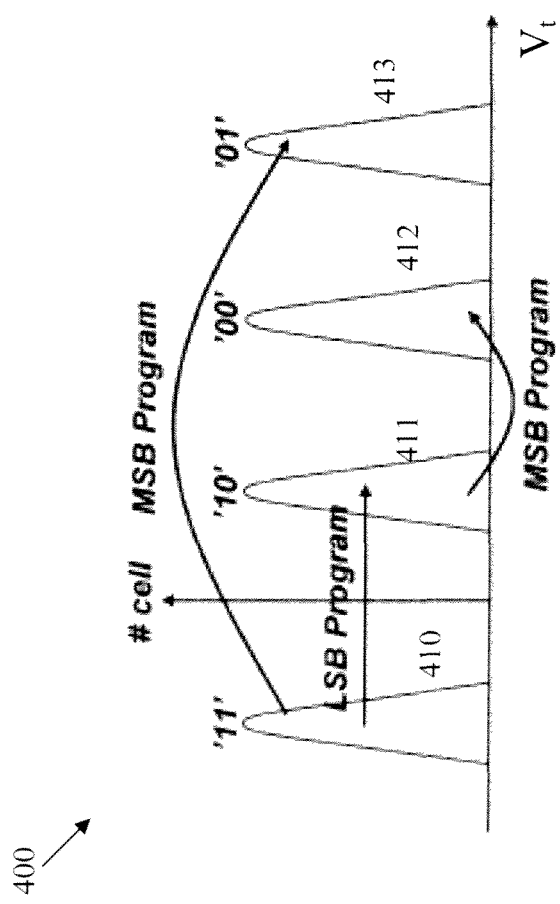
FIG. 4 illustrates an exemplary two-stage MLC programming scheme for the voltage assignment scheme of FIG. 2.

FIG. 4 illustrates an exemplary two-stage MLC programming scheme 400 for the voltage assignment scheme of FIG. 2. As shown in FIG. 4, during an LSB program stage, the states of selected cells that are in an erased state 410 move to the lowest programmed state 411 if the LSB is zero. Thus, at the LSB programming stage, a memory cell is programmed from the erased state '11' to '10'. Next, during the MSB program stage, two states, state '00' (412) and state '01' (413) are formed sequentially, depending on the previous LSB data. Generally, during the MSB programming stage, the '10' state is programmed to '00', and the state '11' is programmed to '01'.

It is noted that the programming scheme 400 of FIG. 4 illustrates a maximum voltage shift associated with the change in state from state 410 to state 413. A number of programming schemes have been proposed or suggested to reduce the maximum voltage shift associated with a change in state, and thereby reduce the ICI caused by voltage shifts.

Figure 5:
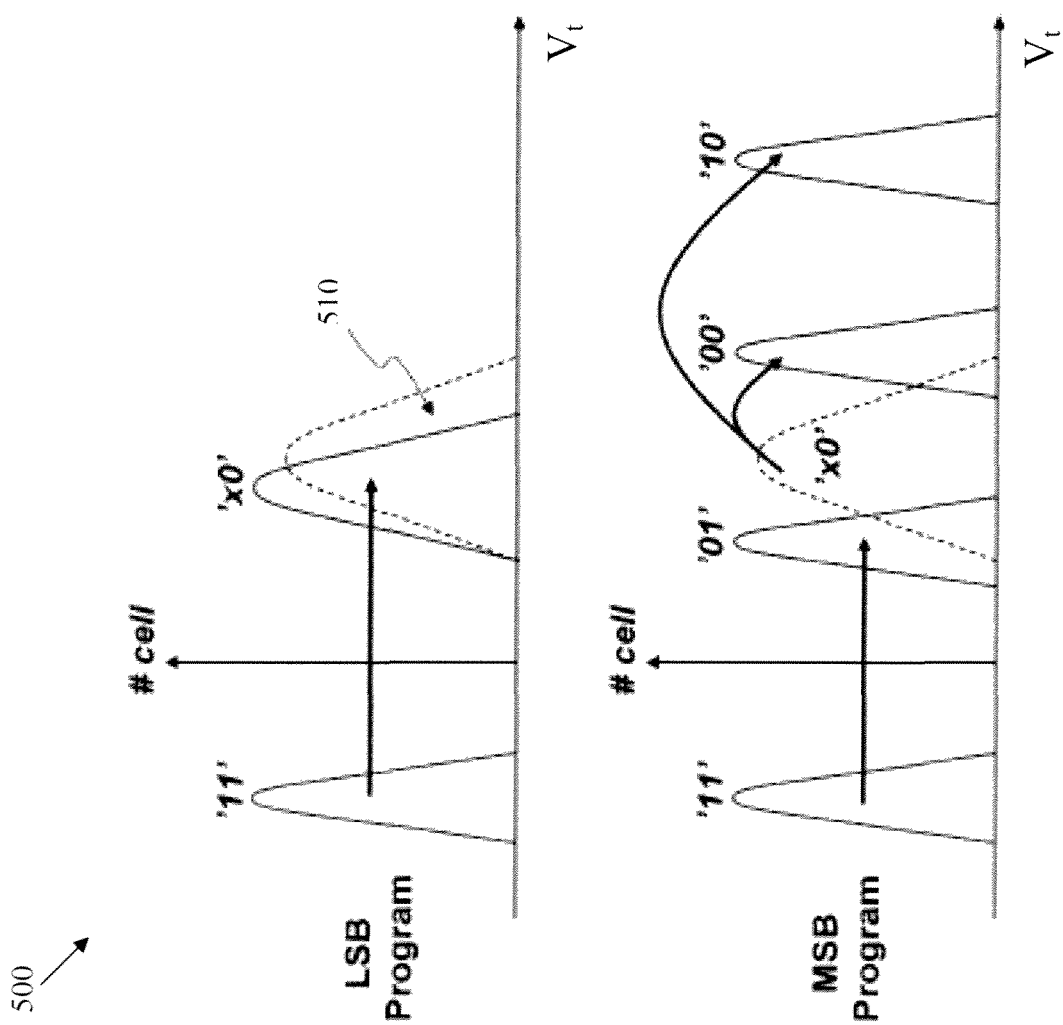
FIGS. 5A and 5B, collectively, illustrate an alternative MLC programming scheme that reduces the ICE inflicted on neighboring cells.

FIGS. 5A and 5B, collectively, illustrate an alternative MLC programming scheme 500 that reduces the ICI inflicted on neighboring cells. As shown in FIG. 5A, during the LSB programming stage, a memory cell is programmed from a state '11' to a state 'x0' as a temporary (or intermediate) state, in a similar manner to SLC programming. After the neighbor cells in the same wordline are also LSB programmed, the distribution is possibly widened as shown by peak 510 in FIG. 5A, due to ICI. Thereafter, at the MSB programming stage, shown in FIG. 5B, the 'x0' state is programmed to either '00' and '10' as the final state corresponding to the input data or else the '11' state is programmed to the final '01' state. Generally, all memory cells except '11' cells are reprogrammed to their final states at the MSB programming stage from the temporary programmed state for LSB data so that the ICI caused by neighbor cells can be largely reduced. A cell in the final state will not suffer from ICI it experienced while being in the intermediate state since it has been reprogrammed to the final state. A cell in the final state will only suffer from ICI it experienced since being in the final state. As noted above, the multi-step programming sequence of FIGS. 5A and 5B, using intermediate program states, reduces the maximum voltage changes and therefore the ICI caused by these voltage changes. It can been seen in FIG. 5B that the maximum voltage shifts for example during the MSB programming stage are associated with transitions from state '11' to '01' and state 'x0' to state '10' respectively. These voltage shifts are significantly smaller than the maximum voltage shift from state '11' to '01' in FIG. 4.

Figure 6:
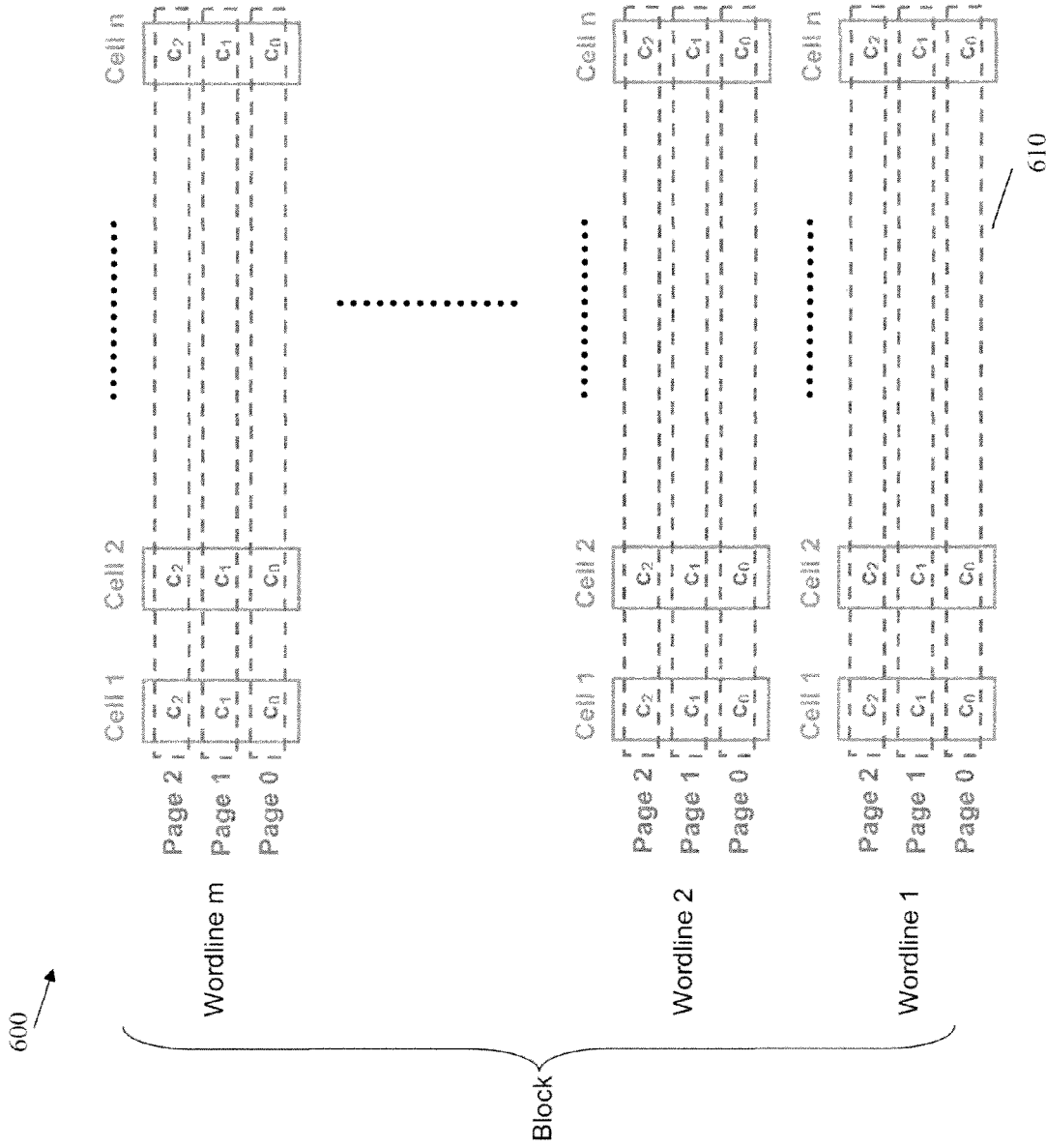
FIG. 6 illustrates an exemplary flash cell array in a multi-level cell (MLC) flash memory device in further detail.

FIG. 6 illustrates an exemplary flash cell array 600 in a multi-level cell (MLC) flash memory device 130 in further detail. As shown in FIG. 6, the flash cell array 600 stores three bits per flash cell, $c_i$. FIG. 6 illustrates the flash cell array architecture for one block, where each exemplary cell typically corresponds to a floating-gate transistor that stores three bits. The exemplary cell array 600 consists of m wordlines and n bitlines. Typically, in current multi-page cell flash memories the bits within a single cell belong to different pages. In the example of FIG. 6, the three bits for each cell correspond to three different pages, and each wordline stores three pages. In the following discussion, pages 0, 1, and 2 are referred to as the lower, middle, and upper page levels within a wordline.

As indicated above, a flash cell array can be further partitioned into even and odd pages, where for example cells with even numbers (such as cells 2 and 4 in FIG. 6) correspond to even pages, and cells with odd numbers (such as cells 1 and 3 in FIG. 6) correspond to odd pages. In this case, a page (such as page 0) would contain an even page (even page 0) in even cells and an odd page (odd page 0) in odd cells.

Intercell Interference

Figure 7:
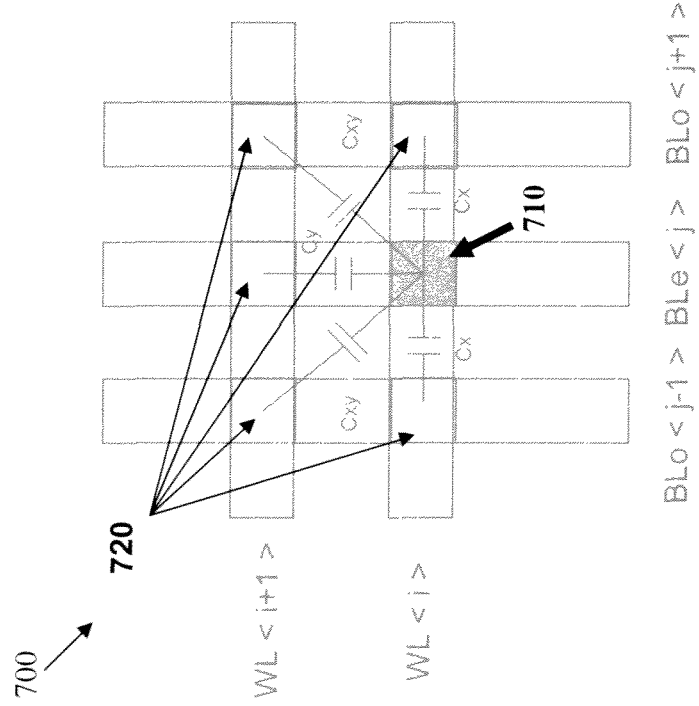
FIG. 7 illustrates the ICI that is present for a target cell due to the parasitic capacitance from a number of exemplary aggressor cells.

As previously indicated, ICI is a consequence of parasitic capacitances between cells and is generally considered to be one of the most prominent sources of distortion. FIG. 7 illustrates the ICI that is present for a target cell 710 due to the parasitic capacitance from a number of exemplary aggressor cells 720. The following notations are employed in FIG. 7:

WL: wordline;
BL: bitline;
BLo: odd bitline;
BLe: even bitline; and
C: capacitance.

The present invention recognizes that ICI is caused by aggressor cells 720 that are programmed after the target cell 710 has been programmed. The ICI changes the voltage, $V_t$, of the target cell 710. In the exemplary embodiment, a "bottom up" programming scheme is assumed and adjacent aggressor cells in wordlines i and i+1 cause ICI for the target cell 710. With such bottom-up programming of a block, ICI from the lower wordline i−1 is removed, and up to five neighboring cells contribute to ICI as aggressor cells 720, as shown in FIG. 7. It is noted, however, that the techniques disclosed herein can be generalized to cases where aggressor cells from other wordlines, such as wordline i−1, contribute to ICI as well, as would be apparent to a person of ordinary skill in the art. If aggressor cells from wordlines i−1, i and i+1 contribute to ICI, up to eight closest neighboring cells need to be considered. Other cells that are further away from the target cell can be neglected, if their contribution to ICI is negligible. In general, the aggressor cells 720 are identified by analyzing the programming sequence scheme (such as bottom up or even/odd techniques) to identify the aggressor cells 720 that are programmed after a given target cell 710.

The ICI caused by the aggressor cells 720 on the target cell 710 can be modeled in the exemplary embodiment as follows:

$$\Delta V_{ICI}^{(i,j)} = k_x \Delta V_t^{(i,j-1)} + k_x \Delta V_t^{(i,j+1)} + k_y \Delta V_t^{(i+1,j)} + k_{xy} \Delta V_t^{(i+1,j-1)} + k_{xy} \Delta V_t^{(i+1,j+1)} \quad (1)$$

where $\Delta V_t^{(w,b)}$ is the change in $V_t$ voltage of agressor cell (w,b), $\Delta V_{ICI}^{(i,j)}$ the change in $V_t$ voltage of target cell (i,j) due to ICI and $k_x, k_y,$ and $k_{xy}$ are capacitive coupling coefficients for the x, y and xy direction.

Generally, $V_t$ is the voltage representing the data stored on a cell and obtained during a read operation. $V_t$ can be obtained by a read operation, for example, as a soft voltage value with more precision than the number of bits stored per cell, or as a value quantized to a hard voltage level with the same resolution as the number of bits stored per cell (e.g., 3 bits for 3 bits/cell flash).

ICI Mitigation Using Modulation Coding

According to one aspect of the present invention, ICI mitigation is achieved by selecting signal levels from a given modulation code that reduces the ICI from adjacent cells 720 on any given target cell 710. As discussed further below, constrained modulation coding techniques are employed to reduce data patterns that cause significant ICI. Generally, a modulation code can reduce the ICI on any given cell 710 from one or more adjacent cells 720 by reducing the number of cells programmed with the maximum voltage shift. In other words, the present invention reduces ICI by reducing the probability of using voltage cells during programming associated with the highest voltage shift.

Generally, the disclosed modulation encoding techniques of the present invention are applied during the programming of a flash memory. According to one aspect of the invention, the modulation encoder 810, discussed further below in conjunction with FIG. 8, selects one or more levels for programming the flash memory such that a reduced number of cells in the flash memory are programmed with a value that violates one or more predefined criteria. In an exemplary embodiment, the predefined criteria, is based on one or more of (i) an amount of disturbance caused by the programmed cell; (ii) a voltage shift of a programmed cell; (iii) a voltage stored by a programmed cell; (iv) an amount of change in current associated with a pro cell; and (v) an amount of current associated with a programmed cell.

Likewise, the disclosed modulation decoding techniques of the present invention are applied during the reading of a flash memory. According to one aspect of the invention, the modulation decoder 890, discussed further below in conjunction with FIG. 8, assigns one or more levels to cells in the flash memory such that a reduced number of cells in the flash memory are read with a value that violates one or more of the above-described exemplary predefined criteria.

The present invention recognizes that the ICI on a given target cell 710 is a function of the voltages programmed on one or more aggressor cells 720. In addition, as shown by equation (1), the resultant ICI caused by a given aggressor cell 720 on the target cell 710 will be greater when the voltage shift (ΔV) on the given aggressor cell 720 is greater. The maximum voltage shift (ΔV) for exemplary two-stage MLC programming schemes 400, 500 was discussed above in conjunction with FIGS. 4, 5A and 5B. For example, if it is assumed that programming of a binary "zero" has a larger voltage shift (ΔV) than programming of a binary "one," then ICI reduction is achieved by reducing the probability of a binary "zero" in any encoded bit.

A. Reverse ECC Configuration

Figure 8:
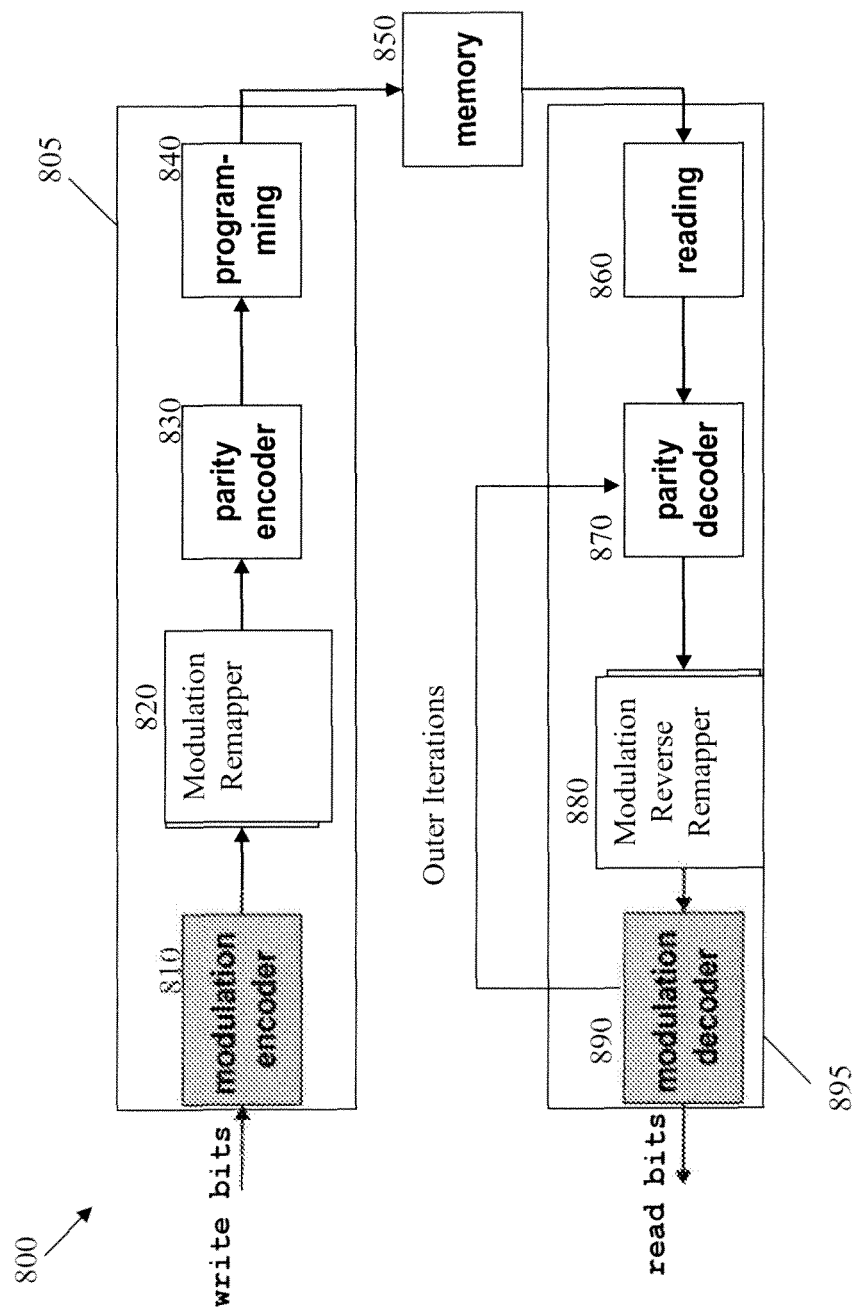
FIG. 8 is a schematic block diagram of an exemplary flash memory system incorporating ICI mitigation techniques using modulation coding in accordance with the present invention.

FIG. 8 is a schematic block diagram of an exemplary flash memory system 800 incorporating ICI mitigation techniques using modulation coding in accordance with the present invention. As shown in FIG. 8, the exemplary flash memory system 800 comprises a write path 805 and a read path 895. The exemplary write path 805 comprises a modulation encoder 810, an optional modulation remapper 820 and an optional parity encoder 830. The memory 850 is programmed during stage 840, using known techniques.

In a further embodiment of the invention, the modulation encoder 810 reduces the average charge per user bit (i.e., the charge that is stored in the floating gate transistor). By reducing the average charge per user-bit, write-power and wear-out are also reduced.

The modulation encoder 810 can encode one or more pages in a wordline independently (such as only the MSB page) or all pages in a wordline jointly. The coding overhead due to modulation coding is reduced, if modulation coding is applied only to for example the MSB page, while the other lower pages are not modulation encoded. When a multi-step programming sequence is employed as shown for example in FIGS. 5A and 5B, the final program states suffer only from ICI due to the programming of MSB pages. Therefore, modulation encoding can be applied only to the MSB pages to reduce the overall coding overhead and achieve the highest possible storage capacity.

The codeword length n of the code used by the exemplary modulation encoder 810 can be any integer. and the number of user bits k is k equals n−1. The constrained code implemented by the exemplary modulation encoder 810 minimizes the number of zeros in each codeword as follows. Whenever there are more than k/2 zeros in the k user bits, the exemplary modulation encoder 810 flips all k bits and sets a flag or polarity bit to 1. Otherwise, the exemplary modulation encoder 810 does not flip the user bits and sets a flag or polarity bit to 0.

In one exemplary embodiment, the modulation encoder 810 initially determines the number of binary "zeroes" in a page for exemplary page-level access techniques (or for a wordline for exemplary wordline-level access techniques). For a more detailed discussion of page-level and wordline-level access techniques, see, for example, International Patent Application Serial No. PCT/US09/36810, filed Mar. 11, 2009, entitled "Methods and Apparatus for Storing Data in a Multi-Level Cell Flash Memory Device with Cross-Page Sectors, Multi-Page Coding And Per-Page Coding," incorporated by reference herein.

In this exemplary embodiment, if the number of binary "zeroes" in a page is greater than half of the total number of bits in the page, then the exemplary modulation encoder 810 negates (i.e., flips) all of the bits in the page and an additional binary "one" is appended to the page as a flag or polarity bit to indicate that the page has been negated. If the number of binary "zeroes" in a page is not greater than half of the total number of bits in the page, then the modulation encoder 810 maintains the same page data and an additional binary "zero" is appended to the page as a flag or polarity bit to indicate that the page has not been negated. Thus, the complexity of the exemplary modulation encoder 810 is low, requiring only a counter and bit flipping logic.

It is noted that the disclosed embodiment of the modulation encoder 810 is exemplary, and other modulation encoding techniques could be employed, as would be apparent to a person of ordinary skill in the art.

Figure 9:
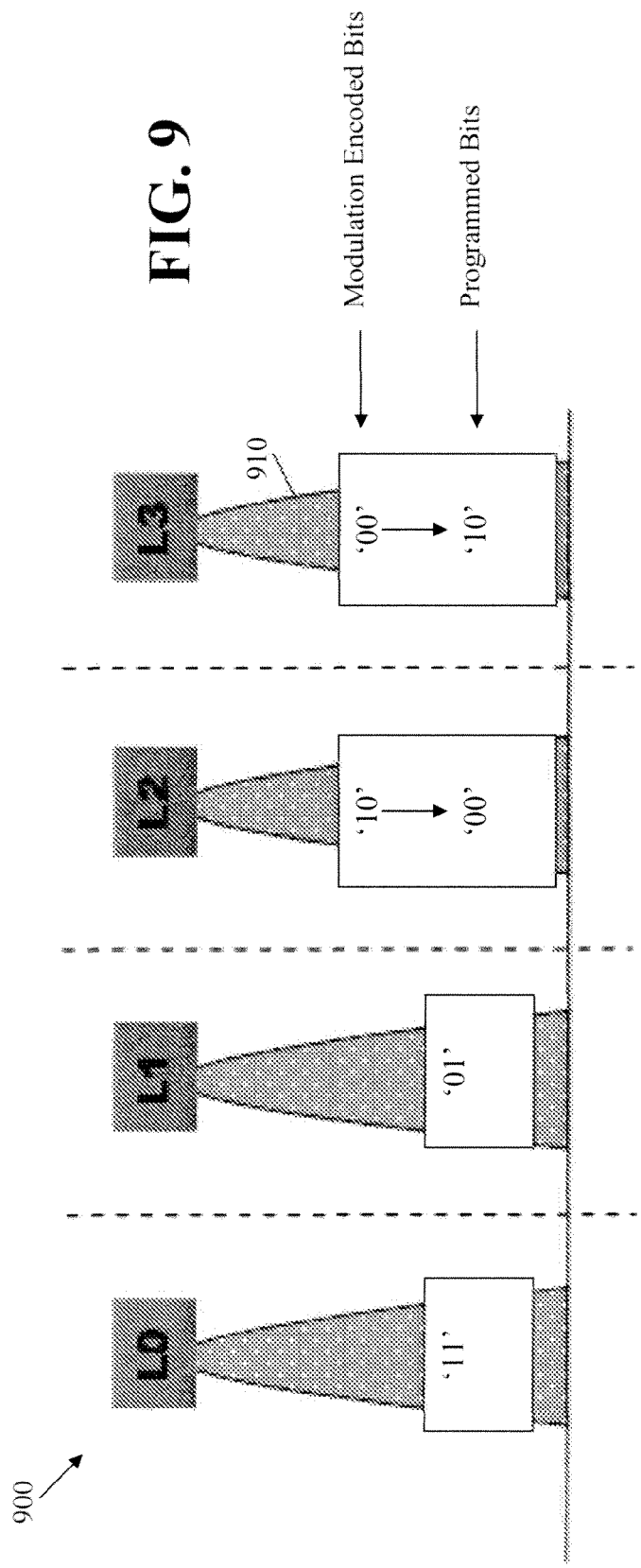
FIG. 9 illustrates the remapping of bit labels associated with some states after modulation encoding by the modulation remapper of FIG. 8.

To maximize the gain in the exemplary modulation coding embodiment (where programming of a binary "zero" is assumed to have a larger voltage shift ($\Delta V$) than programming of a binary "one"), for the exemplary multi-step programming sequence shown in FIGS. 5A and 5B the highest voltage jump during the last programming stage needs to have an MSB of '0'. This requirement is not satisfied for the exemplary programming scheme 500 shown in FIG. 5B. Looking at the bit labels associated with voltage states shown in FIG. 5B, the MSBs do not satisfy the requirement. For example, the highest voltage jump from intermediate state 'x0' leads to final state '10' with MSB "one". Thus, the programming scheme may require re-mapping of the states after the modulation encoder 810. To ensure that the highest voltage change during the last programming stage is associated with an MSB of '0' at the output of the modulation encoder, the exemplary modulation remapper 820 remaps the bit labels associated with some states after modulation encoding into the desired final bit labels, as shown in FIG. 9. For example, for state 910, a binary MSB "one" of the final bit label '10' has the largest voltage shift during MSB programming, so the bit label for this state is remapped from an original '00' at the output of the modulation encoder to a final bit label '10' at the output of the modulation remapper, and the bit label for voltage level or state L2 is remapped from an original '10' at the output of the modulation encoder to a final bit label '00' at the output of the modulation remapper. This final bit label '10' is programmed into the flash memory for voltage level or state L3, and the final bit label '00' is programmed into the flash memory for voltage level or state L2.

Thus, the modulation remapper 820 determines if a given state requires remapping, and implements the remapping, if necessary. For example, if during MSB programming it is determined that the current intermediate state is 'x0', and if the MSB for this state after modulation encoding is 0, then this MSB bit is remapped to '1' and the final state L3 with the bit label '10' is written to the flash. It should be noted that the modulation remapper can process bits within a memory cell separately or jointly, and it can also process only a subset of bits within a memory cell, while the other bits within the cell are not processed by the modulation remapper. Also, the modulation remapping scheme shown here is exemplary, and other modulation remapping schemes can be employed as it would apparent to a person of ordinary skill in the art.

Since the modulation remapper 820 follows the modulation encoder 810, and the parity encoder 830 follows the modulation remapper 820, the flash memory system 800 is referred to as a reverse ECC configuration, where the modulation encoder 810 precedes the parity encoder 830.

The optional parity encoder 830 may implement well known error correction encoding techniques, such as Low-Density Parity-Check (LPDC), Reed-Solomon or BCH encoding techniques. In one preferred implementation, the parity encoder 830 is implemented as a systematic encoder, such that the original bits are preserved by the parity encoder 830 and the parity encoder 830 adds the parity bits to the original bits.

The memory 850 is read during stage 860, using known techniques. The exemplary read path 895 comprises a parity decoder 870, an optional modulation reverse remapper 880 and a modulation decoder 890 that each perform an inverse function to the corresponding block in the write path 805. The modulation decoder 890 evaluates the flag bit to determine if the bits on the page need to be flipped. In the exemplary embodiment, if the parity bit is set to 1, then all k user bits are flipped by the modulation decoder 890.

If the parity decoder 870 uses soft information, an outer global iteration loop can be introduced, as shown in FIG. 8. The global iteration loop performs outer iterations between the parity decoder 870. such as an LPDC decoder, and the modulation decoder 890 as follows. If the LDPC decoder 870 does not converge (after a predefined maximum number of inner iterations), then the LDPC decoder 870 sends the entire LDPC codeword to the optional modulation reverse remapper 880 and the modulation decoder 890. It is noted that one LDPC codeword consists of many shorter modulation codewords. For example, an LDPC codeword can comprise 33000 bits, and a modulation codeword can comprise 100 bits (i.e., the coderate is 0.99 for a constraint code). Then, each LDPC codeword consists of 330 modulation codewords.

The modulation decoder 890 can calculate the number of zeros in each codeword. Whenever the number of zeros in each codeword is greater than k/2, then the modulation decoder 890 has identified an invalid codeword. Then, the modulation decoder 890 can either flip the sign bits of the LLR values corresponding to the invalid codeword (mode 1), or it can erase the LLR values of all the bits of the codeword (by simply setting these LLR values to 0) (mode 2), and send the result back to the parity decoder 870 (for example an LDPC decoder). The parity decoder 870 (for example an LDPC decoder) receives the modified LLR values from the modulation decoder 890 and attempts to decode the modified LLR values by running again multiple inner iterations. The additional redundancy provided by the modulation code is therefore used for improving error correction performance. This iterative decoding process can be applied until the read data is successfully decoded.

As indicated above, FIG. 9 illustrates the remapping of modulated (that is modulation encoded) bits to the programmed states during an MSB programming stage. As shown in FIG. 9, modulated bit 'zero' always corresponds to the maximum voltage shift, both for the programming of the LSB page and MSB page, where state 'x0' is associated with the maximum voltage shift during LSB programming, and states '01' (with modulated bits '01) and '10' (with modulated bits '00') are associated with the maximum voltage shifts during MSB programming. As can be seen from FIGS. 5A, 5B and 9, voltage levels L0 and L1 with the programmed bit labels '11' and '01' do not require remapping during MSB programming.

B. Direct ECC Configuration

Figure 10:
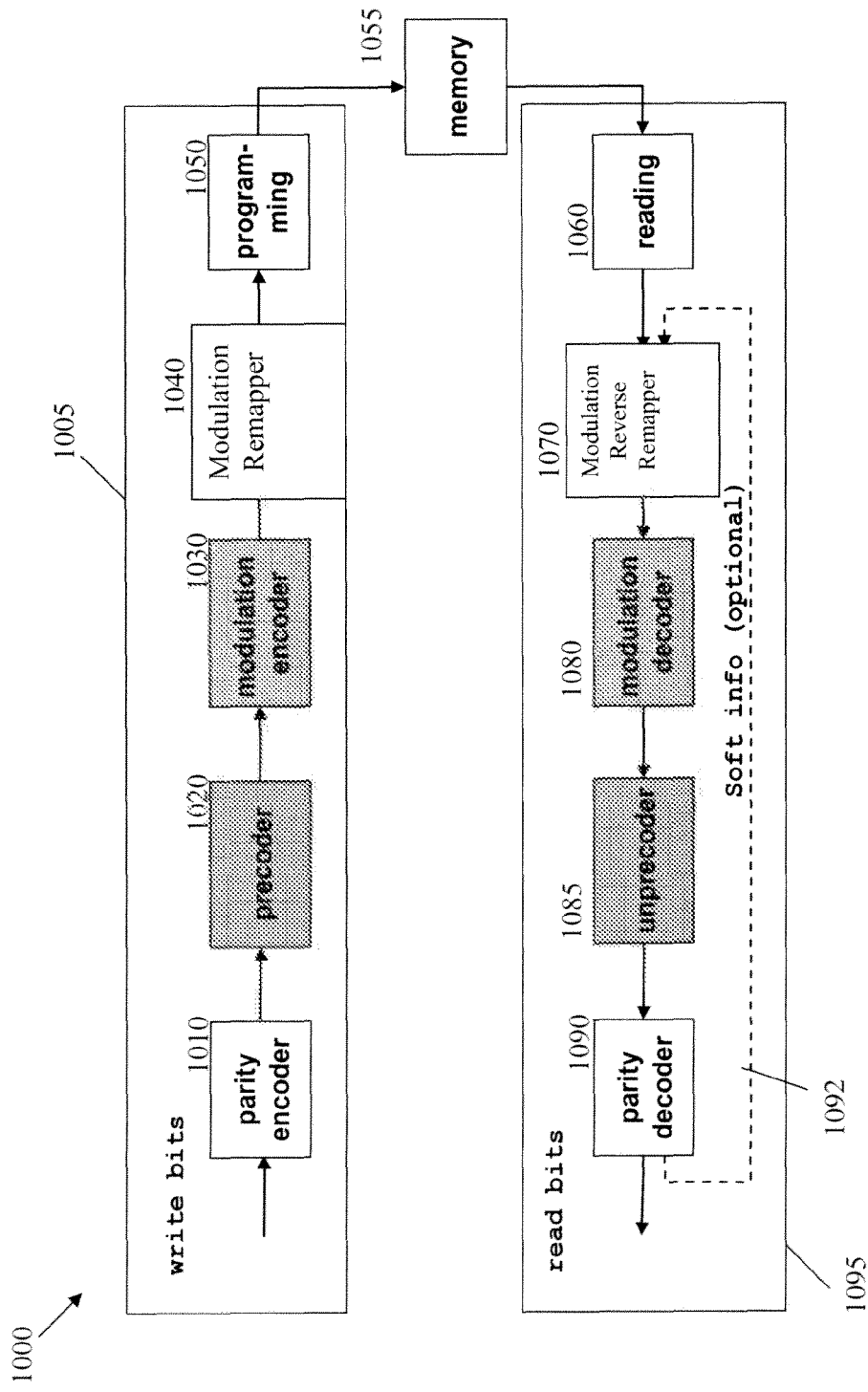
FIG. 10 is a schematic block diagram of an exemplary flash memory system incorporating ICI mitigation techniques using modulation coding in accordance with the present invention.

FIG. 10 is a schematic block diagram of an exemplary flash memory system 1000 incorporating ICI mitigation techniques using modulation coding in accordance with the present invention. As shown in FIG. 10, the exemplary flash memory system 1000 comprises a write path 1005 and a read path 1095. The exemplary write path 1005 comprises an optional parity encoder 1010, a modulation encoder 1030, and an optional modulation remapper 1040, in a similar manner to FIG. 8. The memory 1055 is programmed during stage 1050, using known techniques.

The memory 1055 is read during stage 1060, using known techniques. The exemplary read path 1095 comprises an optional modulation reverse mapper 1070, a modulation decoder 1080, and an optional parity decoder 1090, that each perform an inverse function to the corresponding block in the write path 1005. The modulation decoder 1080 evaluates the flag bit to determine if the bits on the page need to be flipped. In the exemplary embodiment, if the parity bit is set to 1, then all k user bits are flipped by the modulation decoder 1080.

Since the parity encoder 1010 is followed by the modulation encoder 1030, the flash memory system 1000 is referred to as a direct ECC configuration. In a direct ECC configuration. parity bits are modulated along with information bits. However, at the receiver, the modulation decoder 1080 may propagate errors to error bursts in the form of polarity flips: if the polarity bit (that is the flag bit) is in error, the whole modulation codeword is flipped in error. Thus, the exemplary flash memory system 1000 includes a precoder 1020 in a preferred embodiment of the direct ECC configuration. The exemplary precoder 1020 may apply, for example, the well-known $1/(1 \oplus D)$ precoder, where $\oplus$ denotes modulo-2 addition. Consequently, the unprecoder 1085 in the receive path 1095 reduces each error burst to just two errors. Alternate known m n precoding techniques can be employed, such as $1/(1 \oplus D^2)$ or $1/(1 \oplus D^3)$ precoding schemes, as would be apparent to a person of ordinary skill in the art.

As shown in FIG. 10, an optional global iteration loop can be employed. The global iteration loop performs outer iterations between the parity decoder 1090, such as an LPDC decoder, and the modulation decoder 1080 or optional reverse mapper 1070. The parity decoder 1090 in FIG. 10 provides soft information (LLR) to the modulation decoder 1080 or optional reverse mapper 1070 and then global iterations are performed until the data is decoded without errors.

While the disclosed modulation coding techniques have been described in the context of ICI mitigation, the disclosed modulation techniques could also be used to mitigate other distortions, as would be apparent to a person of ordinary skill in the art. Likewise, while the exemplary embodiment employed a modulation code that reduces the number of 0s, other modulation or constrained codes can be used within the spirit of the invention to impose constraints on the data written to the flash to mitigate ICI or other distortions, as would be apparent to a person of ordinary skill in the art.

Process, System and Article of Manufacture Details

While a number of flow charts herein describe an exemplary sequence of steps, it is also an embodiment of the present invention that the sequence may be varied. Various permutations of the algorithm are contemplated as alternate embodiments of the invention. While exemplary embodiments of the present invention have been described with respect to processing steps in a software program, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a recordable medium (e.g., floppy disks, hard drives, compact disks, memory cards, semiconductor devices, chips, application specific integrated circuits (ASICs)) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

We claim:

1. A method for programming a flash memory, comprising:
performing a modulation encoding that selects one or more levels for programming said flash memory such that a reduced number of cells in said flash memory are programmed with a value that violates one or more predefined criteria.

2. The method of claim 1, wherein said one or more predefined criteria is based on one or more of an amount of disturbance caused by the programmed cell; a voltage shift of the programmed cell; a voltage stored by the programmed cell; an amount of change in current through the programmed cell; and an amount of current through the programmed cell.

3. The method of claim 1, wherein said modulation encoding is performed on one or more pages in a wordline independently.

4. The method of claim 3, wherein said modulation encoding is performed only on a subset of pages in said wordline.

5. The method of claim 1, wherein said modulation encoding is performed for two or more pages in a wordline jointly.

6. The method of claim 1, wherein said modulation encoding is performed for two or more pages in separate wordlines jointly.

7. The method of claim 1, further comprising the step of performing a parity encoding after said modulation encoding in a reverse ECC configuration.

8. The method of claim 1, further comprising the step of performing a parity encoding prior to said modulation encoding in a direct ECC configuration.

9. The method of claim 1, further comprising the step of remapping one or more program states to ensure that one or more program states have a predefined binary value.

10. The method of claim 1, further comprising the step of applying a precode following a parity encoding to reduce error propagation at an output of a modulation decoder.

11. The method of claim 10, wherein said precode comprises a $1/(1 \oplus D)$, $1/(1 \oplus D^2)$ or $1/(1 \oplus D^3)$ precoding scheme.

12. The method of claim 1, wherein a first predefined binary value causes more disturbance than a second predefined binary value and wherein said modulation encoding selects one or more levels for programming said flash memory such that a reduced number of cells in said flash memory are programmed with said first predefined binary value.

13. The method of claim 12, wherein said modulation encoding flips all k bits in k user bits if there are more than k/2 of said first predefined binary value.

14. A method for programming a flash memory, comprising:
encoding data using a modulation code to reduce an occurrence of one or more data patterns that cause disturbance in one or more cells in said flash memory; and
programming one or more cells in said flash memory using said encoded data.

15. The method of claim 14, wherein said modulation code constrains a use of saw one or more predefined levels.

16. The method of claim 15, wherein said one or more predefined levels comprise one or more levels that violate one or more predefined criteria.

17. The method of claim 16, wherein said one or more predefined criteria is based on one or more of an amount of disturbance caused by the programmed cell; a voltage shift of the programmed cell; a voltage stored by the programmed cell; an amount of change in current through the programmed cell; and an amount of current through the programmed cell.

18. The method of claim 14, further comprising the step of selecting one or more levels for programming said flash memory such that a reduced number of cells in said flash memory are programmed with one or more predefined levels to reduce disturbance in one or more cells in said flash memory.

19. A method for reading a flash memory, comprising:
obtaining data from said flash memory, wherein said data is encoded with a modulation code that reduces an occurrence of one or more data patterns that cause disturbance in one or more cells in said flash memory; and
performing a modulation decoding on said data.

20. The method of claim 19, wherein said modulation decoding is performed on one or more pages in a wordline independently.

21. The method of claim 20, wherein said modulation decoding is performed only on a subset of pages in said wordline.

22. The method of claim 19, wherein said modulation decoding is performed for two or more pages in a wordline jointly.

23. The method of claim 19, wherein said modulation decoding is performed for two or more pages in separate wordlines jointly.

24. The method of claim 19, further comprising the step of reverse remapping one or more program states to ensure that one or more program states have a predefined binary value.

25. The method of claim 19, wherein a precode is applied following a parity encoding to reduce error propagation at an output of a modulation decoder.

26. The method of claim 25, wherein said precode comprises a $1/(1 \oplus D)$, $1/(1 \oplus D^2)$ or $1/(1 \oplus D^3)$ precoding scheme.

27. The method of claim 19, further comprising the step of performing multiple iterations using soft information.

28. The method of claim 19, wherein a first predefined binary value causes more disturbance than a second predefined binary value and wherein said modulation decoding assigns one or more levels for programming said flash memory such that a reduced number of cells in said flash memory are read with said first predefined binary value.

29. The method of claim 19, wherein said modulation code assigns one or more levels to cells in said flash memory such that a reduced number of cells in said flash memory are read with a value that violates one or more predefined criteria.

30. A system for programming a flash memory, comprising:
a modulation encoder that encodes data using a modulation code to reduce an occurrence of one or more data patterns that cause disturbance in one or more cells in said flash memory; and
a programmer that programs one or more cells in said flash memory using said encoded data.

31. The system of claim 30, wherein said modulation code selects one or more levels for programming said flash memory such that a reduced number of cells in said flash memory are programmed with one or more predefined levels.

32. The system of claim 30, wherein said modulation code constrains a use of one or more program levels.

33. The system of claim 30, wherein one or more program states are remapped to ensure that one or more program states have a predefined binary value.

34. The system of claim 30, wherein said modulation encoder analyzes data to be programmed in said flash memory device to determine a frequency of one or more data patterns.

35. The system of claim 30, wherein said modulation encoder selects one or more levels for programming said flash memory such that a reduced number of cells in said flash memory are programmed with one or more predefined levels to reduce disturbance in one or more cells in said flash memory.

36. A system for reading a flash memory, comprising:
a modulation decoder that obtains data from said flash memory, wherein said data is encoded by a modulation encoder with a modulation code that reduces an occurrence of one or more data patterns that cause disturbance in one or more cells in said flash memory; and performs a modulation decoding on said data.

37. The system of claim 36, wherein said modulation code assigns one or more levels to cells in said flash memory such that a reduced number of cells in said flash memory are read with a value that violates one or more predefined criteria.

38. The method of claim 37, wherein said one or more predefined criteria is based on one or more of an amount of disturbance caused by the programmed cell; a voltage shift of the programmed cell; a voltage stored by the programmed cell; an amount of change in current through the programmed cell; and an amount of current through the programmed cell.

* * * * *